March 22, 1960 R. S. BARK 2,929,996

CHOPPER AMPLIFIERS

Filed Feb. 24, 1959

INVENTOR.
RAYMOND S. BARK

BY K. W. Thomas

ATTORNEY

United States Patent Office 2,929,996
Patented Mar. 22, 1960

2,929,996

CHOPPER AMPLIFIERS

Raymond S. Bark, Seattle, Wash., assignor to Boeing Airplane Company, Seattle, Wash., a corporation of Delaware Application February 24, 1959, Serial No. 795,232
4 Claims. (Cl. 330—10)

This invention relates to electrical amplifiers and more particularly to chopper amplifiers for breaking up an input signal into a plurality of segments.

A chopper amplifier is a device which is utilized to amplify a direct-current or a slowly varying monopolar or bipolar signal with a greater degree of accuracy than can be accomplished by a direct-current amplifier which has undesirable drift characteristics. The chopper amplifier comprises means for converting the above mentioned input signal to a chopped signal, an alternating-current amplifier for amplifying the chopped signal, and a demodulator for converting the amplified voltage to a wave form similar to that of the original input signal.

Heretofore, chopper amplifiers have been divided into two main classes, a narrow band chopper amplifier and a wide band chopper-stabilized amplifier. The first class, the narrow band chopper amplifier, is capable of handling signals down to within a few decibels of thermal noise level. However, the bandwidth or frequency response of such a prior art chopper amplifier is poor. For instance, the upper modulation frequency of the input voltage normally is limited to one-tenth or less of the chopping frequency. In other words, it is not possible when utilizing such a prior art chopping method to effect a substantially instantaneous transition when going from one signal level or polarity to another during the chopping operation. Usually if this prior art chopper amplifier employs a half-wave chopper, such as a single-pole single-throw chopping switch, then information is lost during one of the two switch positions. Even if a double-throw chopping switch is employed, some information is lost because there will be a time when the chopper's moveable contact will be either in the circuit open position relative to its stationary contacts or the moveable contact will be short circuiting its stationary contacts. Thus, the upper modulation frequency of the input signal must normally be kept to one-tenth or less of the chopper frequency if substantially no signal input information is to be lost.

The second class of prior art chopper amplifier, the wide band chopper-stabilized amplifier, comprises an electronic direct-current amplifier and a narrow band chopper amplifier which stabilizes the electronic amplifier. This prior art chopper amplifier has the advantage that it is capable of handling input signals from direct-current to high frequency; however, it has the disadvantage that it is stable down to only approximately 100 microvolts. Thus, there is a need for a chopper amplifier which would cover the frequency range above that of the first class of prior art chopper amplifier and the voltage range below that of the second class of prior chopper amplifier.

Therefore, an object of this invention is to provide a chopper amplifier having a wide bandwidth so as to effectively respond to input signals from direct-current to high frequency irrespective of chopper rate and yet be capable of effectively responding to low level input signals while still maintaining stability.

Another object of this invention is to provide in a chopper amplifier for effecting a substantially instantaneous transition when going from one signal level or polarity to another during the breaking up of the input signal into segments so that all of the signal input information appears on the segments, thus enabling the chopping rate of the amplifier to be independent of the frequency of the input signal.

A more specific object of this invention is to provide for alternately changing the impedance of one arm of a bridge while at all times maintaining the arm in circuit connection with the bridge, thereby alternately unbalancing the bridge in one direction and then in the other direction to thus substantially instantaneously chop up into segments an input signal applied to the input of the bridge without any substantial loss of information.

Other objects of this invention will become apparent from the following description when taken in conjunction with the accompanying drawing in which.

Figure 1:
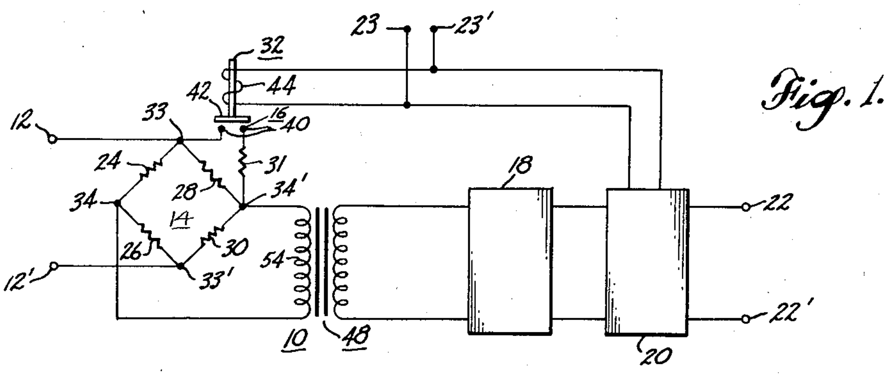
Fig. 1 is a schematic diagram of circuits and apparatus illustrating one embodiment of the teachings of this invention.

Referring to Fig. 1 there is illustrated a chopper amplifier 10 embodying the teachings of this invention. In general, the chopper amplifier 10 comprises input terminals 12 and 12′ to which is applied an input voltage; a Wheatstone bridge 14; chopper means 16 for alternately unbalancing the Wheatstone bridge 14 in one direction and then in the other direction, to thus effectively chop up the input signal applied to the input terminals 12 and 12′ into segments and thus produce at the output of the Wheatstone bridge 14 a chopped signal or alternating output voltage; an alternating-current amplifier 18 connected to be responsive to the chopped signal; and a triggered or synchronous bipolar demodulator 20 connected to be responsive to the amplified output signal from the amplifier 18, so as to produce across output terminals 22 and 22′ a voltage whose wave form is similar to the wave form of the input signal applied to the input terminals 12 and 12′.

The amplifier 18 is a conventional alternating-current amplifier, however, it should have good square wave characteristics, that is, a good frequency and phase response, is required. The bipolar demodulator 20 is likewise conventional such as shown in Figures 14.24, 14.26, 14.27, and 14.28 of volume 19 of the Radiation Laboratory Series, entitled "Wave Forms." The trigger or synchronizing voltage for the demodulator 20 is obtained from terminals 23 and 23′.

In particular, the Wheatstone bridge 14 includes four arms, each of which includes a linear resistance element, specifically the resistance elements 24, 26, 28 and 30. In this instance, each of the resistance elements 24, 26 and 30 have a substantially equal value of resistance. On the other hand, the resistance element 28 has a substantially higher value of resistance than any of the other resistance elements 24, 26 or 30. The arm of the Wheatstone bridge which includes the resistance element 28 also includes another linear resistance element 31 which is adapted to be alternately connected in shunt circuit relationship with the resistance element 28 in accordance with the operation of a chopper switch 32. In practice, the resistance value of the resistance element 31 is such that when the resistance element 31 is connected in shunt circuit relationship with the resistance element 28, by means of the chopper switch 32, the parallel circuit including the resistance elements 28 and 31 has a lower value of resistance than any of the resistance elements 24, 26 or 30.

As illustrated, the input terminals 12 and 12′ are electrically connected to input terminals 33 and 33′, respectively, so that the input signal to the chopper amplifier 10 is applied across one diagonal of the Wheatstone bridge 14.

As hereinbefore mentioned, the chopper means 16 is provided in order to alternately effect an unbalance of the Wheatstone bridge 14 in one direction and then in the other direction, to thereby effect a chopped signal or alternating output voltage between output terminals 34 and 34′, and thus across the other diagonal of the Wheatstone bridge 14. Specifically, the chopper means 16 comprises the chopper switch 32 which is a conventional chopper switch and which includes stationary contacts 40, a moveable contact 42 disposed to be actuated into and out of engagement with the stationary contacts 40, and an operating coil 44 disposed to effect an actuation of the moveable contact 42 in accordance with an alternating voltage applied to the terminals 23 and 23′. Thus, as can be seen from Fig. 1 the driving voltage for the operating coil 44 is also applied to the bipolar demodulator 20 so that bipolar demodulation may be obtained as is well understood in the art. Shielding is provided for shielding the contacts 40 and 42 from the operating coil 44. A suitable signal chopper switch for the switch 32 is one manufactured either by the Bristol Company or the Brown Company.

For the purpose of rendering the input of the alternating-current amplifier 18 responsive to the alternating voltage appearing at the output terminals 34 and 34′, of the Wheatstone bridge 14, and for enabling the use of a single ended input for the amplifier 18, a voltage transformer 48 is coupled between the output terminals 34 and 34′ and the input of the amplifier 18.

Figure 2:
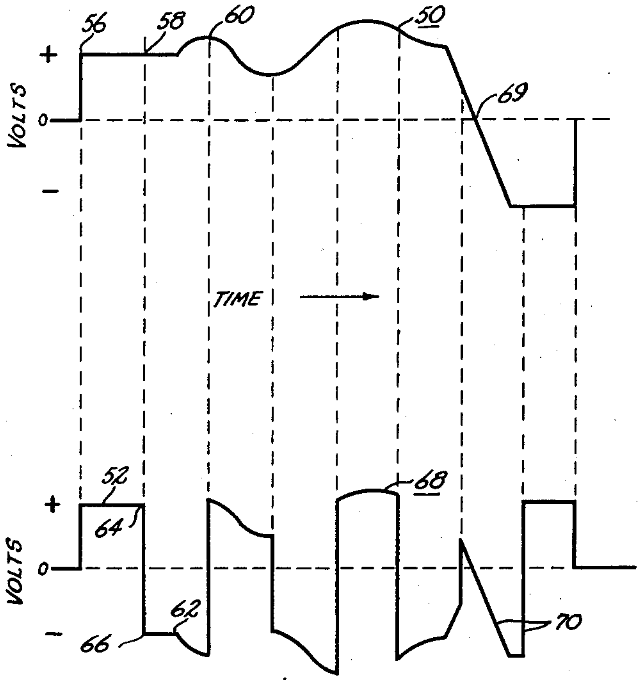
Fig. 2 is a graph illustrating the wave form of both the input voltage to the Wheatstone bridge shown in Fig. 1 and the voltage or signal appearing at the output of the Wheatstone bridge.

The operation of the chopper amplifier 10 will now be described. Assuming an input signal such as shown by a curve 50, in Fig. 2, is applied to the input terminals 12 and 12′, of the chopper amplifier 10, with the terminal 12 at a positive polarity with respect to the terminal 12′, and assuming further that an alternating voltage of a predetermined rate is applied to the terminals 23 and 23′, of the chopper switch 32, then with the moveable contact 42 in a circuit open position, as shown, the terminal 34, of the Wheatstone bridge 14, is at a higher positive potential than is the terminal 34′. This voltage between the output terminals 34 and 34′, and thus the output voltage across one diagonal of the Wheatstone bridge 14, is represented at 52, in Fig. 2. With the terminal 34 at a higher positive potential than the terminal 34′, current flows from the terminal 34 through the primary winding 54, of the transformer 48, to the terminal 34′ to thus produce at the output terminals 22 and 22′, of the chopper amplifier 10, an amplified voltage whose wave shape is similar to that of the curve 50 from the point 56 to the point 58.

After a time duration as represented at the point 58 the movable contact 42, of the chopper switch 32, is actuated to the circuit closed position with respect to its stationary contacts 40 and the resistance element 31 is connected in shunt circuit relationship with the resistance element 28. Under such a condition the arm of the Wheatstone bridge 14, including the resistance elements 28 and 31, has a lower value of resistance than when only resistance element 28 was connected in circuit relationship with the bridge 14, and therefore the output terminal 34′ is at a higher positive potential than the output terminal 34. The voltage now appearing between the output terminals 34 and 34′, of the Wheatstone bridge 14, from the point 58 to a point 60, as represented in Figure 2, is as shown at 62. During this portion of the operation when the moveable contact 42, of the chopper switch 32, is in circuit closed position with respect to its stationary contacts 40, current flows from the output terminal 34′, of the Wheatstone bridge 14, through the primary winding 54, of the transformer 48, to the output terminal 34 to thus effect an amplified voltage at the output terminals 22 and 22′ which has a wave shape similar to the wave shape of the curve 50 between the points 58 and 60.

It is to be noted that at no time is the arm of the Wheatstone bridge 14, which includes the resistance elements 28 and 31, electrically disconnected from the remaining portion of the Wheatstone bridge 14. Therefore, the transition in going from one signal level or polarity as represented at 64 to another signal level or polarity as indicated at 66 is substantially instantaneous. In other words, substantially no information is lost in going from the input terminals 12 and 12′, of the chopper amplifier 10, to its output terminals 22 and 22′.

The above described cycle of operation is then continuously repeated thus producing the remainder of the voltage wave 68 as shown in Figure 2. However, when a point 69, as shown in Fig. 2, is reached, where the input signal applied to the terminals 12 and 12′ reverses polarity, the Wheatstone bridge 14 output voltage therefore also reverses, although the movable contact 42, of the chopper switch 32, remains in the open circuit position, thus effecting the portion 70 of the curve 68.

Figure 3:
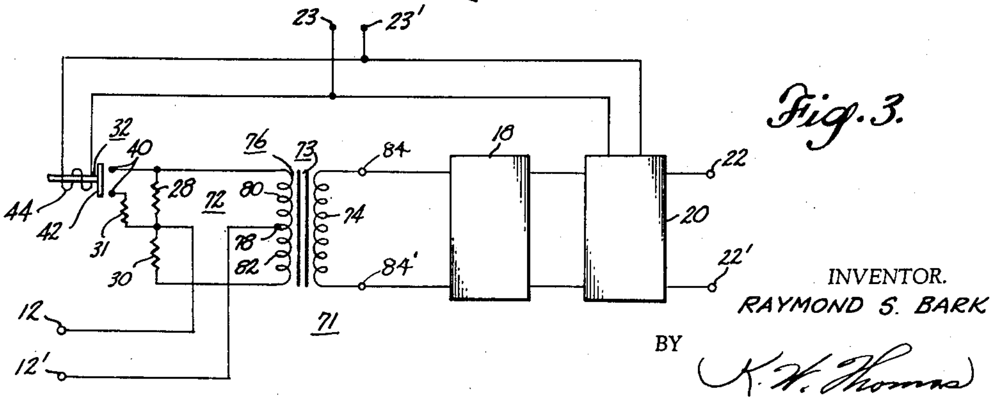
Fig. 3 is a schematic diagram of circuits and apparatus illustrating another embodiment of the teachings of this invention.

Referring to Fig. 3 there is shown a chopper amplifier 71 illustrating another embodiment of the teachings of this invention in which like components of Figs. 1 and 3 have been given the same reference characters. The main distinction between the apparatus of Figs. 1 and 3 is that in the apparatus of Fig. 3 another type of bridge 72 has been substituted for the Wheatstone bridge 14 of the Figure 1.

The bridge 72 comprises the resistance elements 28, 30 and 31 and in addition includes a center-tapped transformer 73 which has a secondary winding 74 and a primary winding 76 having a center tap 78, an upper portion 80 and a lower portion 82. Thus, as can be seen from Fig. 3 the portions 80 and 82 of the primary winding 76 comprise two arms of the bridge 72. The resistance element 30 is the third arm of the bridge 72 while the resistance elements 28 and 31 constitute the fourth arm. In practice, the impedance values of the resistance element 30, the upper portion 80, and the lower portion 82, of the primary winding 76, are substantially equal. On the other hand, the impedance value of the resistance element 28 is substantially greater than the impedance value of any of the other three arms, that is, the members 30, 80, and 82. However, when the resistance element 31 is connected in shunt circuit relationship with the resistance element 28, the impedance value of the resistance element 31 is such that the parallel circuit including the resistance elements 28 and 31 has a lower impedance value than the impedance presented by any of the other arms, that is, the members 30, 80 and 82.

In order to apply the input voltage appearing across the input terminals 12 and 12′ to the input of the bridge 72, the input terminal 12 is electrically connected to the junction point of the resistance elements 28, 30 and 31 and the input terminal 12′ is electrically connected to the center tap 78, of the primary winding 76. As illustrated, output terminals for the bridge 72 appear at 84 and 84′.

The operation of the chopper amplifier 71 will now be described. Assuming that the input terminal 12 is at a positive polarity with respect to the input terminal 12′ and assuming further that the movable contact 42, of the chopper switch 32, is in the circuit open position with respect to its stationary contacts 40, then current flows from the input terminal 12 through a parallel circuit one branch of which includes the resistance element 28 and the upper portion 80, of the primary winding 76, and the other branch of which includes the resistance element 30 and the lower portion 82, of the primary winding 76, to the input terminal 12′. Since the resistance element 28 has a higher impedance value than any one of the other three arms including the members 30, 80 and 82, more current will flow through the branch of the parallel circuit including the resistance element 30 and the lower portion 82 of the primary winding 76, to thus produce across the output terminals 84 and 84', of the bridge 72, a voltage of one polarity.

Assuming the polarity of the voltage applied to the input terminals 12 and 12' remains unchanged, then during the next portion of the cycle of operation when the movable contact 42, of the chopper switch 32, is in circuit closed position with respect to its stationary contacts 40, a current will flow from the input terminal 12 to the input terminal 12' in the same manner as hereinbefore described for the previous portion of the cycle, however, since the parallel circuit including the resistance elements 28 and 31 has a lower value of impedance than the other arms of the bridge 72 including the members 30, 80 and 82, there will be a greater magnitude of current flow through the branch of the parallel circuit including the resistance elements 28 and 31 and the upper portion 80, of the primary winding 76, than will there be through the branch of the parallel circuit including the resistance element 30 and the lower portion 82, of the primary winding 76. Such being the case, the polarity of the voltage across the output terminals 84 and 84', of the bridge 72, will reverse.

When the movable contact 42, of the chopper switch 32, is actuated into the circuit open position with respect to its stationary contacts 40, the hereinbefore described portion of the operation is repeated, thereby again reversing the polarity of the voltage appearing between the output terminals 84 and 84'. In other words, the chopper amplifier 71, of Fig. 3, is capable of chopping the input signal applied to the input terminals 12 and 12' up into segments in the same manner as does the chopper amplifier 10 of Fig. 1. Since the remainder of the operation of the chopper amplifier 71 is similar to the operation of the chopper amplifier 10, a further description of such operation is deemed unnecessary.

It is to be understood that the resistance values of the resistance elements 24, 26, 28, 30 and 31, of the Wheatstone bridge 14, could be other than as described and yet produce the desired results. In addition, the arms of the bridge 14 could be non-linear resistance elements, inductors or capacitors. The last two statements also apply ot the bridge 72 of Fig. 3. Further, it is to be understood that the output terminals 34 and 34', of the Wheatstone bridge 14, could be directly coupled to the input of the alternating-current amplifier 18, thus eliminating the transformer 48, if the amplifier 18 has a doubled ended differential input. It is also to be understood that the resistance element 31 could be so connected to the resistance element 28 that with the movable contact 42, of the chopper switch 32, in the circuit closed position with respect to its stationary contacts 40, the resistance element 31 would only be connected in shunt circuit relationship with a portion of the resistance element 28. Further, if only a monopolar signal is applied to the input terminals 12 and 12', a monopolar demodulator may be substituted for the demodulator 20 and the voltage across the terminals 23 and 23' would not be applied to the substituted demodulator.

The apparatus embodying the teachings of this invention has several advantages. For instance, it is capable of handling input signals from direct-current to high frequency and yet is capable of effectively responding to low level input signals while still being stable. Thus, a chopper amplifier built in accordance with the teachings of this invention is able to handle input signal frequencies which are far in excess of the chopping rate.

Since numerous changes may be made in the above apparatus and circuits and different embodiments of the invention may be made without departing from the spirit and scope thereof, it is intended that all matter contained in the foregoing description or shown in the accompanying drawing shall be interpreted as illustrative and not in a limiting sense.

I claim as my invention:

1. In a chopper amplifier, the combination comprising, a bridge circuit including a plurality of arms, an output, and an input for receiving an input signal, one of the arms of said plurality of arms including a first impedance member and a second impedance member adapted to be alternately connected in shunt circuit relationship with at least a portion of said first impedance member, a chopper switch connected to alternately connect at a predetermined rate said second impedance member in shunt circuit relationship with at least a portion of said first impedance member so as to alternately unbalance said bridge in one direction and then in the other direction and thus produce at the output of said bridge a chopped signal, an alternating-current amplifier having an input and an output, the input of said amplifier being connected to be responsive to said chopped signal to effect an amplified signal at the output of said amplifier, and a demodulator connected to be responsive to said amplified signal.

2. In a chopper amplifier, the combination comprising, a Wheatstone bridge comprising a linear resistance element in each of three of its arms, said resistance elements being of substantially equal resistance value, and a fourth linear resistance element of substantially greater value in its fourth arm, means for applying an input signal across one diagonal of said bridge, another linear resistance element adapted to be alternately connected in shunt circuit relationship with at least a portion of said fourth resistance element, a chopper switch connected to alternately connect at a predetermined rate said another resistance element in shunt circuit relationship with at least a portion of said fourth resistance element so as to alternately unbalance said bridge in one direction and then in the other direction and thus produce across the other diagonal of said bridge a chopped signal, an alternating-current amplifier having an input and an output, the input of said amplifier being connected to be responsive to said chopped signal to effect an amplified signal at the output of said amplifier, and a demodulator connected to be responsive to said amplified signal.

3. The combination comprising, a bridge circuit including a plurality of arms, an output, and an input for receiving an input signal, one of the arms of said plurality of arms including a first impedance member and a second impedance member adapted to be alternately connected in shunt circuit relationship with at least a portion of said first impedance member, and a chopper switch connected to alternately connect at a predetermined rate said second impedance member in shunt circuit relationship with at least a portion of said first impedance member so as to alternately unbalance said bridge in one direction and then in the other direction and thus produce at the output of said bridge a chopped signal.

4. The combination comprising, a Wheatstone bridge comprising a linear resistance element in each of three of its arms, said resistance elements being of substantially equal resistance value, and a fourth linear resistance element of substantially greater resistance value in its fourth arm, means for applying an input signal across one diagonal of said bridge, another linear resistance element adapted to be alternately connected in shunt circuit relationship with at least a portion of said fourth resistance element, and a chopper switch connected to alternately connect at a predetermined rate said another resistance element in shunt circuit relationship with at least a portion of said fourth resistance element so as to alternately unbalance said bridge in one direction and then in the other direction and thus produce across the other diagonal of said bridge a chopped signal.

References Cited in the file of this patent

UNITED STATES PATENTS

| | | |
|---|---|---|
| 2,459,104 | Gilbert | Jan. 11, 1949 |
| 2,562,640 | Reason | July 31, 1951 |
| 2,860,300 | Sampietro | Nov. 11, 1958 |